United States Patent
Hsu et al.

(10) Patent No.: US 9,325,303 B2
(45) Date of Patent: Apr. 26, 2016

(54) BUTTON DETECTING CIRCUIT

(71) Applicant: PIXART IMAGING INC., Hsin-Chu (TW)

(72) Inventors: Cheng Seng Hsu, Hsin-Chu (TW); Jui Te Chiu, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 14/639,196

(22) Filed: Mar. 5, 2015

(65) Prior Publication Data

US 2016/0065197 A1    Mar. 3, 2016

(30) Foreign Application Priority Data

Sep. 3, 2014    (TW) .............................. 103130397 A

(51) Int. Cl.
*H03K 5/153*    (2006.01)
*H03K 5/24*    (2006.01)
*G01R 19/00*    (2006.01)

(52) U.S. Cl.
CPC . *H03K 5/24* (2013.01); *G01R 19/00* (2013.01)

(58) Field of Classification Search
None
See application file for complete search history.

(56) References Cited

U.S. PATENT DOCUMENTS

| | | | |
|---|---|---|---|
| 6,353,432 B1 | 3/2002 | Chiu et al. | |
| 6,437,547 B2 | 8/2002 | Petricek et al. | |
| 7,627,128 B2 | 12/2009 | Sander et al. | |
| 8,138,811 B2 | 3/2012 | Liao et al. | |
| 8,193,836 B2 * | 6/2012 | Nguyen | G01R 19/16552 327/72 |
| 2013/0093467 A1 * | 4/2013 | Kosic | H03K 5/2445 327/77 |

FOREIGN PATENT DOCUMENTS

| | | |
|---|---|---|
| TW | I323419 B | 7/2008 |
| TW | I332282 B | 7/2008 |
| TW | I317576 | 11/2009 |

* cited by examiner

*Primary Examiner* — Long Nguyen
(74) *Attorney, Agent, or Firm* — Li & Cai Intellectual Property (USA) Office

(57) ABSTRACT

The present disclosure illustrates a button detecting circuit and method thereof. The button detecting circuit includes a determining circuit, a voltage selector and a button module. The voltage selector is electrically connected to the determining circuit. The voltage selector has a plurality of candidate voltages arranged in sequence based on magnitudes of the candidate voltages. The button module which is electrically connected to the determining circuit via a single one pin comprises a threshold unit and a button network. The determining circuit receives the candidate voltage outputted from the voltage selector and outputs the candidate voltage to the button module for testing whether the threshold unit will be conducted to find a threshold voltage. The button module generates a scanning current based upon the threshold voltage. The determining circuit senses the scanning current and determines which one of a plurality of buttons disposed in the button network is pressed.

15 Claims, 3 Drawing Sheets

BUTTON DETECTING CIRCUIT

BACKGROUND

1. Technical Field

The present disclosure relates to a button detecting circuit, in particular, to a button detecting circuit which can detect a threshold voltage of a threshold unit disposed in a button module.

2. Description of Related Art

With the advancement of technology, a push-button input device has been widely used in electronic products. The push-button input device often has a button detecting circuit and a button network which is composed by a plurality of buttons. The button detecting circuit can generate a trigger signal based upon a button action of the button network. A back-end circuit determines which one of a plurality of buttons is pressed according to the trigger signal. In a typical push-button input device, one button is corresponding to one pin. When one of a plurality of buttons is pressed to turn on, the button detecting circuit generates the trigger signal correspondingly. Currently, some button detecting circuits are designed into multiple buttons sharing a single one pin to reduce chip area.

Please refer to FIG. 1, which shows a schematic diagram of a conventional button detecting circuit. The conventional button detecting circuit 1 includes a determining circuit 10, a voltage source 11 and a button module 14. The button module 14 works with a charging-discharging principle associate with a capacitor. Each button action of the button module 14 corresponds to an equivalent RC (Resistance-Capacitance) value, wherein the button action means at least one of a plurality of buttons is pressed. Each equivalent RC value corresponds to a different charging time. That is to say, the determining circuit 10 of the conventional button detecting circuit 1 determines which one of a plurality of buttons is pressed according to the charging time corresponding to different button actions.

Currently, one push-button input device often has a plurality of buttons, for example, the button module 14 shown in FIG. 1. The more buttons the push-button input device has, the higher precision the determining circuit 10 should have, such that the determining circuit 10 can exactly determine the button actions of the button module 14. However, cost of the determining circuit 10 also increases with a number of the buttons.

Hence, in order to solve the above problem of the cost of the determining circuit 10 increasing with the number of the buttons, a button detecting circuit is provided. The new button detecting circuit can determine the button actions of the button module, but also can solve the problem of the cost of the determining circuit increasing. On the other hand, the button module may comprise a light-emitting diode (LED) to instruct as to a state of the button module. Thus, suitable voltage should be provided to the button module. The LED will not be falsely triggered due to the voltage. The voltage will not affect the determining circuit to detect the button action of button module.

SUMMARY

An exemplary embodiment of the present disclosure provides a button detecting circuit. The button detecting circuit comprises a determining circuit, a voltage selector and a button module. The determining circuit is electrically connected to a voltage source. The determining circuit comprises a pin. The voltage selector is electrically connected to the determining circuit. The voltage selector comprises a plurality of candidate voltages arranged in sequence based on magnitudes of the candidate voltages and forms a voltage sequence. The button module is electrically connected to the pin. The button module comprises a threshold unit. The voltage selector selects one of the candidate voltages and outputs the selected candidate voltage to the determining circuit. The determining circuit receives the candidate voltage outputted from the voltage selector and outputs the candidate voltage to the button module for testing whether the threshold unit will be conducted to find a threshold voltage. When the threshold unit is not conducted, the determining circuit outputs a determining signal to the voltage selector such that the voltage selector selects a next candidate voltage based upon the voltage sequence and outputs the candidate voltage to the determining circuit. When the threshold unit is conducted, the determining circuit outputs the determining signal to the voltage selector such that the voltage selector selects a candidate voltage which is arranged in front of a current candidate voltage in the voltage sequence as the threshold voltage.

To sum up, the button detecting circuit provided by the exemplary embodiment of the present disclosure can detect the threshold voltage which will not cause the threshold unit to conduct. By providing the threshold voltage to the button module, when one of a plurality of buttons of a button network disposed in the button module is pressed, the button module generates a maximized scanning current based upon the threshold voltage. Accordingly, the determining circuit can exactly determine which one of a plurality of buttons is pressed without expensive and accurate elements. Hence, compared to conventional button detecting circuits, the button detecting circuit provided by the present disclosure reduces cost and simultaneously improves accuracy when detecting a button action.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
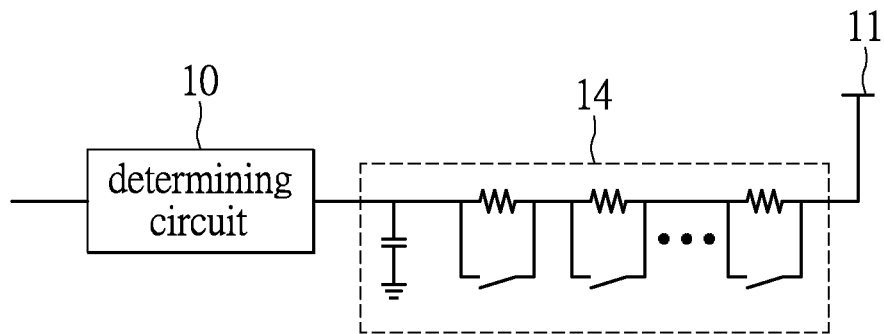
FIG. 1 is a schematic diagram of a conventional button detecting circuit.

Reference will now be made in detail to the exemplary embodiment of the present disclosure, examples of which are illustrated in the accompanying drawings. Wherever possible, the same reference numbers are used in the drawings and the description to refer to the same or like parts.

Figure 2:
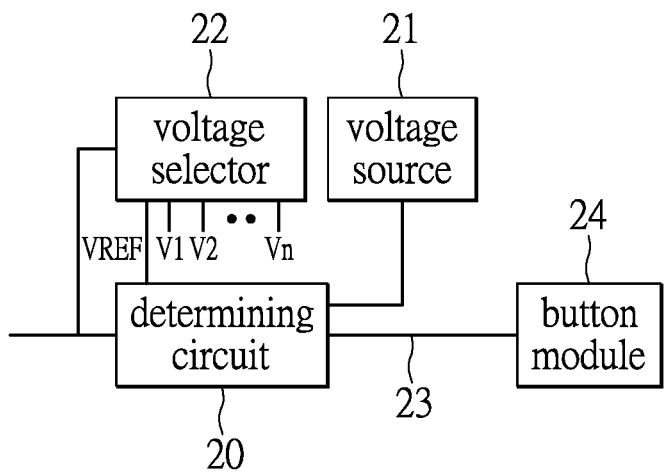
FIG. 2 is a block diagram of a button detecting circuit provided in accordance with an exemplary embodiment of the present disclosure.

Please refer to FIG. 2, which shows a block diagram of a button detecting circuit provided in accordance with an exemplary embodiment of the present disclosure. The button detecting circuit 2 comprises a determining circuit 20, a voltage source 21, a voltage selector 22 and a button module 24. The determining circuit 20 is electrically connected to the voltage source 21. An input end and an output end of the voltage source 21 are electrically connected to the determining circuit 20 respectively. The determining circuit 20 further comprises a pin 23. The button module 24 is electrically connected to the determining circuit 20 via the pin 23.

The determining circuit 20 comprises a suitable circuit, logic element, or other component to receive a voltage from the voltage source 21, and provides a working voltage to the voltage selector 22 and the button module 24. The voltage selector 22 has a plurality of candidate voltages V1-Vn, wherein n is a positive integer greater than 1. A plurality of candidate voltages V1-Vn are arranged in sequence based on magnitudes of the candidate voltages and form a voltage sequence. When the determining circuit 20 starts to provide the working voltage to the voltage selector 22, the voltage selector 22 selects one of the candidate voltages V1-Vn as an output voltage VREF, and outputs the output voltage VREF to the determining circuit 20.

It is worth to note that, in the exemplary embodiment of the present disclosure, a voltage value of a candidate voltage Vi is less than a candidate voltage Vi+1, wherein i is an integer of 1 to n-1. Hence, the voltage selector 22 initially selects the candidate voltage V1 with a minimum voltage value from the voltage sequence, meaning that the candidate voltage V1 is selected as the output voltage VREF. Then, the voltage selector 22 outputs the output voltage VREF to the determining circuit 20 for testing whether a threshold unit (FIG. 2 not shown) of the button module 24 will be conducted. If the threshold unit is not conducted, the voltage selector 22 selects a candidate voltage V2 as the output voltage VREF and outputs the output voltage VREF to the determining circuit 20. If the threshold unit is conducted, the determining circuit 20 determines that the candidate voltage V1 is a threshold voltage. If the threshold unit will not be conducted, the voltage selector 22 selects a candidate voltage V3 as the output voltage VREF and outputs the output voltage VREF to the determining circuit 20. Briefly, when the voltage selector 22 selects a candidate voltage Vj and the threshold unit is conducted, the voltage selector 22 determines that a candidate voltage Vj-1 is the threshold voltage, wherein j is an integer greater than 1. Incidentally, the threshold unit, for example, is a LED or a LED string formed by at least two LEDs.

After receiving the output voltage VREF, the determining circuit 20 outputs the output voltage VREF to the button module 24 for testing whether the threshold unit of the button module 24 will be conducted. If the threshold unit is not conducted, the determining circuit 20 outputs a determining signal to the voltage selector 22, such that the voltage selector 22 selects a next candidate voltage based upon the voltage sequence and outputs the candidate voltage to the determining circuit 20. In contrast, if the threshold unit is conducted, the determining circuit 20 outputs the determining signal to the voltage selector 22, such that the voltage selector 22 selects the candidate voltage which is arranged in front of a current candidate voltage in the voltage sequence as a threshold voltage. Then, the voltage selector 22 keeps outputting the threshold voltage to the determining circuit 20.

For example, the voltage selector 22 initially outputs the candidate voltage V1 to the determining circuit 20. The determining circuit 20 outputs the candidate voltage V1 to the button module 24. If the threshold unit of the button module 24 is conducted, the determining circuit 20 outputs the determining signal (such as a low level determining signal) to the voltage selector 22. After receiving the low level determining signal, the voltage selector 22 selects the candidate voltage V2 based upon the voltage sequence, wherein the candidate voltage V2 is arranged behind the candidate voltage V1 in the voltage sequence. Then, the voltage selector 22 outputs the candidate voltage V2 to the determining circuit 20, such that the determining circuit 20 tests whether the threshold unit will be conducted once again.

Repeating the above steps, when the candidate voltage (such as candidate voltage V5) is great enough to cause the threshold unit to conduct, the determining circuit 20 outputs the determining signal (such as a high level determining signal) to the voltage selector 22. After receiving the high level determining signal, the voltage selector 22 selects the candidate voltage V4 as the threshold voltage, wherein the candidate voltage V4 is arranged in front of the candidate voltage V5 in the voltage sequence. Then, the voltage selector 22 keeps outputting the threshold voltage as the output voltage VREF to the determining circuit 20.

Since the voltage selector 22 keeps outputting the output voltage VREF to the determining circuit 20, the determining circuit 20 keeps outputting the output voltage VREF to the button module. Thus, when at least one of a plurality of buttons of a button network (not shown in FIG. 2) disposed in the button module 24 is pressed, the button module 24 generates a maximized scanning current based upon the threshold voltage. The determining circuit 20 outputs a button detecting signal in response to the scanning current, wherein the button detecting signal is configured to instruct which one of a plurality of buttons of the button network is pressed. Because of the scanning current is maximized, the determining circuit 20 can exactly determine which one of a plurality of buttons of the button network is pressed without expensive and accurate elements, and correspondingly generate the button detecting signal. Simultaneously, the threshold unit will not be falsely triggered when neither one of the buttons of the button network is pressed.

Figure 3A:
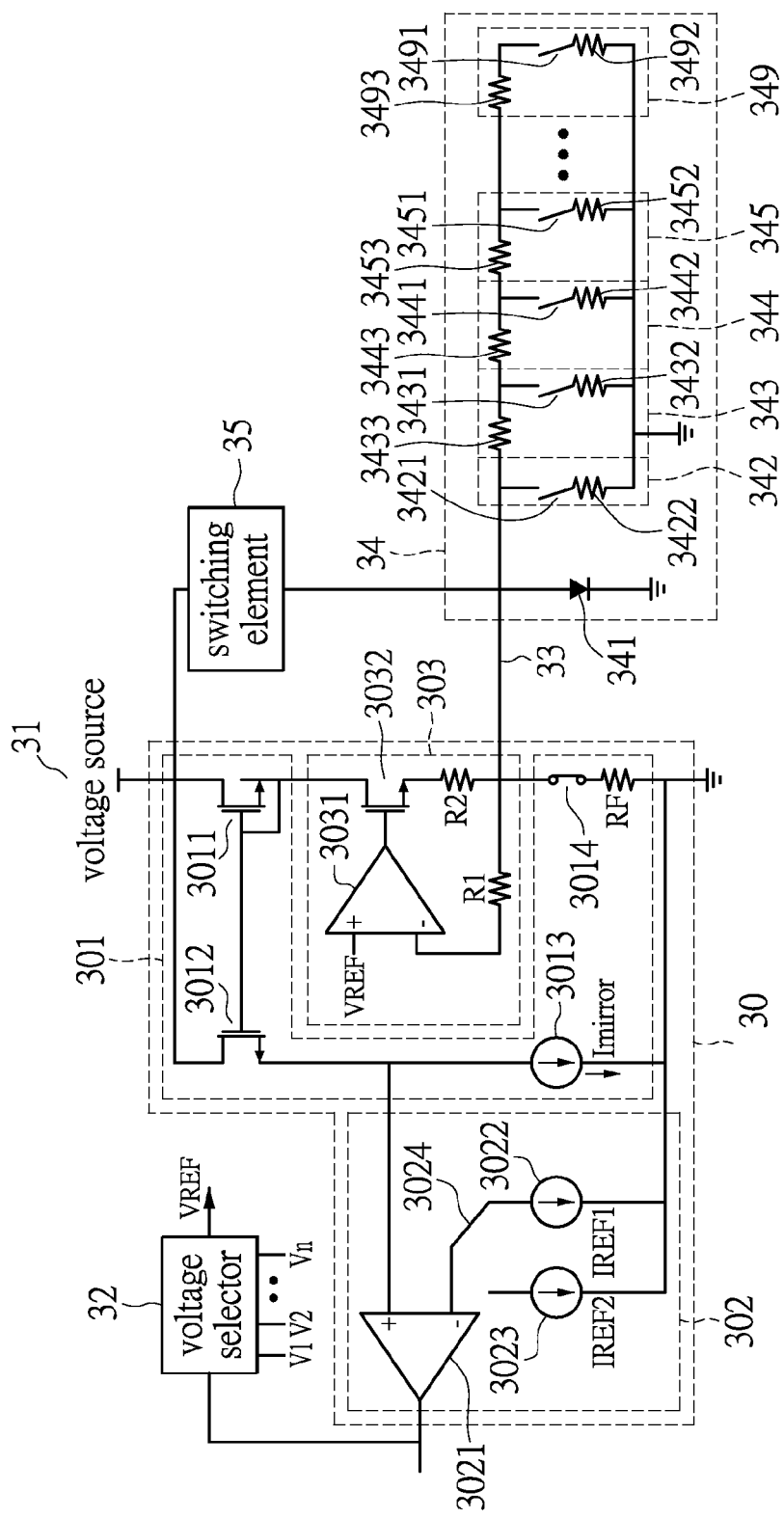
FIG. 3A is a circuit diagram of the button detecting circuit when detecting a threshold voltage provided in accordance with the exemplary embodiment of the present disclosure.

In more detail, please refer to FIG. 3A, which shows a circuit diagram of the button detecting circuit when detecting a threshold voltage provided in accordance with the exemplary embodiment of the present disclosure. Similarly, the button detecting circuit 3 shown in FIG. 3A includes a determining circuit 30, a voltage source 31, a voltage selector 32 and a button module 34. Connection relationships between the determining circuit 30, the voltage source 31, the voltage selector 32 and the button module 34 are similar to FIG. 2, further descriptions are hereby omitted.

The determining circuit 30 includes a current mirror 301, current comparing unit 302, a voltage output unit 303 and a determining unit (not shown in FIG. 3A). The current mirror 301 is electrically connected to the voltage source 31. The current comparing unit 302 is electrically connected to the current mirror 301. The voltage output unit 303 is electrically connected to the current mirror 301 and the voltage selector 32. Moreover, the voltage output unit 303 comprises a pin 33. The voltage output unit 303 is electrically connected to the button module 34 via the pin 33. The determining unit is electrically connected to the current comparing unit 302. Before a threshold voltage is found, the determining unit does not work.

The current mirror 301 includes two metal-oxide-semiconductor field-effect transistors (MOSFET), a bias current source 3013, a switch 3014 and a feedback resistor RF. The two MOSFETs are such as two N-type MOSFETs 3011, 3012. Gates of the two N-type MOSFETs 3011, 3012 are electrically connected to each other. Drains of the two N-type MOSFETs 3011, 3012 are electrically connected to the voltage source 31. A source of the N-type MOSFET 3011 is electrically connected to the voltage output unit 303. A source of the N-type MOSFET 3012 is electrically connected to the current comparing unit 302 and the bias current source 3013. One end of the switch 3014 is electrically connected to the button module 34 via the pin 33, and the end of the switch 3014 is electrically connected to the source of the N-type MOSFETs 3011 via the voltage output unit 303. Another end of the switch 3014 is electrically connected to one end of the feedback resistor RF. Another end of the feedback resistor RF is coupled to a ground. It is worth to note that, when detecting the threshold voltage, an initial state of the switch 3014 is a closed state. The above structures and components of the current mirror 301 are just an example. Those skilled in the art can design the current mirror 301 according to requirements, and the present disclosure is not limited thereto.

When detecting the threshold voltage, the current mirror 301 outputs a mirror current Imirror to the current comparing unit 302 in response to a current which flows through a threshold unit 341 of the button module 34. The mirror current Imirror is equal to a current which the bias current source 3013 outputs. It is worth to note that a mirror ratio of the current mirror 301 is M:1. However, the present disclosure is not limited thereto. For convenience of description, the mirror ratio of the current mirror 301 is 1:1 in the following exemplary embodiment.

The current comparing unit 302 includes a current comparator 3021, a first reference current source 3022, a second reference current source 3023 and a current source switch 3024. A non-inverting input end of the current comparator 3021 is electrically connected to the source of the N-type MOSFETs 3012. An inverting input end of the current comparator 3021 is electrically connected to the current source switch 3024. The current source switch 3024 is electrically connected to one of the first reference current source 3022 and the second reference current source 3023. When detecting the threshold voltage, the current source switch 3024 is electrically connected to the first reference current source 3022. The output end of the current comparator 3021 is electrically connected to the voltage selector 32.

When detecting the threshold voltage, the inverting input end of the current comparator 3021 is electrically connected to the first reference current source 3022 via the current source switch 3024, such that the inverting input end of the current comparator 3021 receives a first reference current IREF1 provided from the first reference current source 3022. A value of the first reference current IREF1 is equal to a current which is great enough to cause the threshold unit to conduct.

That is to say, the non-inverting input end of the current comparator 3021 receives the mirror current Imirror outputted from the current mirror 301, and the inverting input end of the current comparator 3021 receives the first reference current IREF1 provided from the first reference current source 3022. Accordingly, the current comparing unit 302 can determine whether the current flowing through the threshold unit 341 of the button module 34 is great enough to cause the threshold unit to conduct, and output the determining signal to the voltage selector 32. Functions and connection relationships of the voltage selector 32 are similar to the voltage selector 22 shown in FIG. 2, and further descriptions are hereby omitted.

The voltage output unit 303 is configured to receive an output voltage VREF outputted from the voltage selector 32, and output the output voltage VREF to the button module 34. The voltage output unit 303 includes an output buffer and a transistor 3032, wherein the output buffer is composed of a comparator 3031, a resistor R1 and a resistor R2. A non-inverting input end of the comparator 3031 is electrically connected to an output end of the voltage selector 32, configured to receive the output voltage VREF outputted from the voltage selector 32. An inverting input end of the comparator 3031 is electrically connected to the pin 33 via the resistor R1. An output end of the comparator 3031 is electrically connected to a gate of the transistor 3032, and configured to control the transistor 3032 to conduct. A drain of the transistor 3032 is electrically connected to the source of the N-type MOSFETs 3011. A source of the transistor 3032 is electrically connected to the pin 33 via the resistor R2. When a switching element 35 is not conducted, a negative feedback path formed by the comparator 3031 will not be destroyed, such that the output buffer and the transistor 3032 form a source follower. Thus, a voltage which the voltage output unit 303 provides to the pin 33 is equal to the output voltage VREF.

The button module 34 comprises the threshold unit 341 and a button network, wherein the button network is composed by a first button unit 342 and a plurality of second button units 343, 344, . . . , 349. The threshold unit 341 is electrically connected to the button network in parallel. The first button unit 342 and the second button units 343, 344, . . . , 349 are electrically connected to each other. In addition, the pin 33 is electrically connected to the threshold unit 341, the first button unit 342 and the second button units 343, 344, . . . , 349.

It is worth to note that the threshold unit 341 can be a LED or a LED string formed by at least two LEDs. However, the present disclosure is not limited thereto. Those skilled in the art can design the threshold unit 341 according to requirements.

The first button unit 342 includes a first button 3421 and a first button resistor 3422. One end of the first button resistor 3422 is coupled to the first button 3421, and another end of the first button resistor 3422 is coupled to the ground. The second button units 343, 344, . . . , 349 correspondingly includes second buttons 3431, 3441, . . . , 3491, second button resistors 3432, 3442, . . . , 3492 and third button resistors 3433, 3443, . . . , 3493. One end of the second button resistors 3432, 3442, . . . , 3492 is coupled to one end of the second buttons 3431, 3441, . . . , 3491 respectively. One end of the third button resistors 3433, 3443, . . . , 3493 is coupled to another end of the second buttons 3431, 3441, . . . , 3491 respectively. Another end of the second button resistors 3432, 3442, . . . , 3492 is coupled to the ground respectively.

The present disclosure disclosing the second button units 343, 344, . . . , 349 is just an exemplary embodiment. Briefly, a number of the second button units should not be limited by example of the instant embodiment. Those skilled in the art can design the number of the second button units based upon requirements.

Each one of the second button resistors 3432, 3442, . . . , 3492 has a resistance value different from each other. A relationship between the resistance values of the second button resistors 3432, 3442, . . . , 3492 is $N:(N+1):(N+1): \ldots : (N+M-1)$, wherein N is a positive integer, and M represents the number of the second button resistors. In the exemplary embodiment, M is 7. Furthermore, the relationship between the resistance values of the second button resistors 3432, 3442, . . . , 3492 is not limited to the examples provided by the exemplary embodiment. In other exemplary embodiment, the relationship between the resistance values of the second button resistors 3432, 3442, . . . , 3492 also can be $N^0:N^1: N^2: \ldots :N^{M-1}$. However, the relationship between the resistance values of the second button resistors 3432, 3442, . . . , 3492 should not be limited by example of the exemplary embodiment.

By designing the resistance values of the second button resistors 3432, 3442, . . . , 3492, when one of the first button unit 342 and the second button units 343, 344, . . . , 349 is pressed, the button module 34 can correspondingly generate a scanning current. For example, the scanning current generated by the button module 34 when the first button 3421 is pressed is different from the scanning current generated by the button module 34 when the second button 3431 is pressed. That is to say, the exemplary embodiment of the present disclosure determines which one of the first button 3421 and the second buttons 3431, 3441, . . . , 3491 is pressed according to the current value of the scanning current.

Similar to the above step, in order to find the threshold voltage, the voltage selector 32 selects one of candidate voltages V1-Vn (e.g. candidate voltage V1) as the output voltage VREF, and outputs the output voltage VREF to the voltage output unit 303 of the determining circuit 30. Since the voltage output unit 303 forms the source follower, the voltage which the voltage output unit 303 outputs to the pin 33 is equal to the output voltage VREF. Next, the determining circuit 30 detects whether the output voltage VREF will cause the threshold unit 341 to conduct.

When the threshold unit 341 is not conducted, a current sensed by the current mirror 301 of the determining circuit 30 is a current flowing through the feedback resistor RF. Further, the mirror current Imirror which the current mirror 301 outputs to the current comparator 3021 of the current comparing unit 302 and the current flowing through the feedback resistor RF are in a proportional relationship. The current comparator 3021 generates the determining signal (such as a low level determining signal) based upon the mirror current Imirror and the first reference current IREF1, and outputs the determining signal to the voltage selector 32. Then, the voltage selector 32 selects the next candidate voltage (e.g. candidate voltage V2) as the output voltage VREF, and outputs the output voltage VREF to the voltage output unit 303.

When the output voltage VREF (e.g. candidate voltage V5) will cause the threshold unit 341 to conduct, the current sensed by the current mirror 301 is equal to a sum of the two currents respectively flowing through the feedback resistor RF and the threshold unit 341. Further, the mirror current Imirror which the current mirror 301 outputs to the current comparator 3021 and the current which is the sum of two currents respectively flowing through the feedback resistor RF and the threshold unit 341 are in a proportional relationship. The current comparator 3021 generates the determining signal (such as a high level determining signal) based upon the mirror current Imirror and the first reference current IREF1, and outputs the determining signal to the voltage selector 32. Then, the voltage selector 32 selects a candidate voltage V4 which is arranged in front of the candidate voltage V5 in a voltage sequence as the threshold voltage, and keeps outputting the candidate voltage V4 to the voltage output unit 303.

To sum up, the button detecting circuit 3 provided by the present disclosure can find the threshold voltage which will not cause the threshold unit 341 to conduct by using the determining circuit 30 and the voltage selector 32. After the button detecting circuit 3 finds the threshold voltage, the determining circuit 30 outputs the determining signal to the voltage selector 32, and commands the voltage selector 32 to keep outputting the threshold voltage to the determining circuit 30. Next, the voltage output unit 303 of the determining circuit 30 keeps outputting the threshold voltage to the button module 34. The button module 34 generates the scanning current based upon the threshold voltage and a button action of the button network. Briefly, after finding the threshold voltage, the determining circuit 30 scans the button module 34 to determine which one of a plurality of buttons disposed in the button network is pressed. Generally speaking, the button detecting circuit 3 detects the threshold voltage during product testing in the factory. However, the present disclosure is not limited thereto. For example, the button detecting circuit 3 also can detect the threshold voltage periodically, or a user can operate the button detecting circuit 3 to detect the threshold voltage.

Next, details about scanning the button module 34 will be described. Please refer to FIG. 3B, which shows a circuit diagram of the button detecting circuit after detecting the threshold voltage provided in accordance with the exemplary embodiment of the present disclosure. Elements and connection relationships provided by the button detecting circuit 3 in FIG. 3B are similar to the button detecting circuit 3 in FIG. 3A, and therefore only differences between FIG. 3A and FIG. 3B will be described below.

Figure 3B:
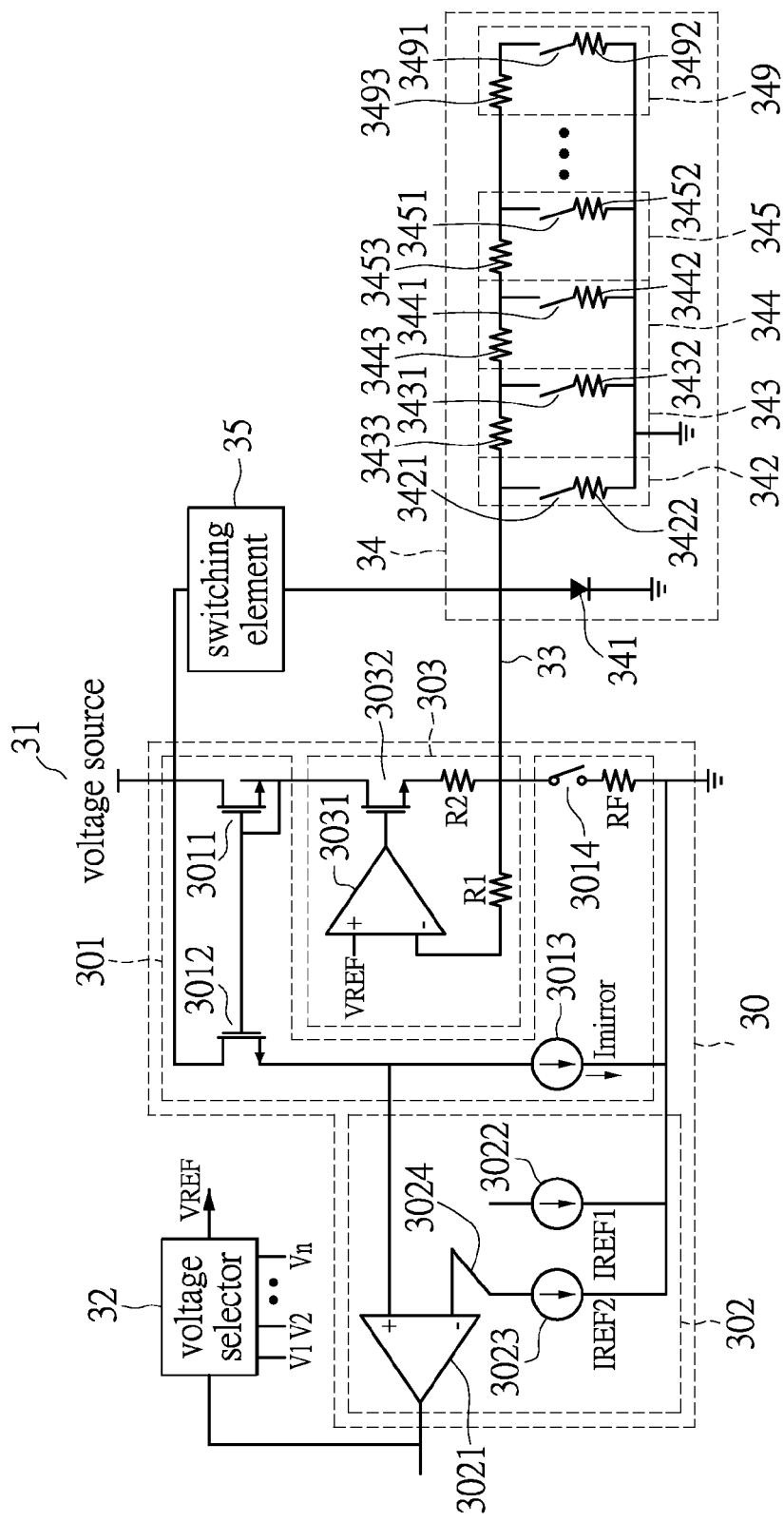
FIG. 3B is a circuit diagram of the button detecting circuit after detecting the threshold voltage provided in accordance with the exemplary embodiment of the present disclosure.

In FIG. 3B, when the determining circuit 30 finds the threshold voltage, the current source switch 3024 switches, such that the inverting input end of the current comparator 3021 of the current comparing unit 302 is electrically connected to the second reference current source 3023 via the current source switch 3024. The current comparator 3021 receives a second reference current IREF2 from the second reference current source 3023. On the other hand, the switch 3014 enters an open state, and the determining unit (not shown in FIG. 3B) starts to work.

Further, when one of the buttons of the button network disposed in the button module 34 is pressed, the current mirror 301 senses the scanning current generated by the button module 34, and correspondingly outputs the mirror current Imirror in response to the scanning current. Since the switch 3014 is in the open state, the mirror current Imirror which the current mirror 301 outputs to the current comparator 3021 of the current comparing unit 302 and the scanning current flowing through the button network are in a proportional relationship. The second reference current IREF2 is not constant. The second reference current IREF2 changes with the scanning current, such that the current comparing unit 302 can determine whether the scanning current is less than the current second reference current IREF2, and output a comparing signal. The determining unit determines which one of a plurality of buttons of the button network is pressing now based upon the current second reference current IREF2 and the comparing signal. Then, the determining unit generates the determining signal, and outputs the determining signal to a back-end circuit (not shown in FIG. 3B).

Moreover, the button detecting circuit 3 further comprises a switching element 35. The switching element 35 is coupled to the voltage source 31, the determining circuit 30 and the button module 34. The switching element 35 is configured to control the voltage source 31 to provide voltage to the button module 34. When one of the buttons of the button network is pressed, the switching element 35 is turned on, such that the voltage source 31 starts to provide voltage to the threshold unit 341 causing the threshold unit 341 to conduct. When neither one of the buttons of the button network is pressed, the switching element 35 is turned off, and the threshold unit 341 will not be conducted.

In summary, the button detecting circuit provided by the present disclosure can detect and find the threshold voltage which will not cause the threshold unit of the button module to conduct before the button detecting circuit starts to scan the button module. By providing the threshold voltage to the button module, when one of a plurality of buttons of a button network disposed in the button module is pressed, the button module generates a maximized scanning current based upon the threshold voltage. Accordingly, the determining circuit can exactly determine which one of a plurality of buttons is pressed without expensive and inaccurate elements. Hence, compared to current button detecting circuits, the button detecting circuit provided by the present disclosure reduces cost and simultaneously improves accuracy when detecting a button action.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A button detecting circuit, comprises:
    a determining circuit electrically connected to a voltage source, and the determining circuit comprising a pin;
    a voltage selector electrically connected to the determining circuit, and the voltage selector comprising a plurality of candidate voltages arranged in sequence based on magnitudes of the candidate voltages and forming a voltage sequence; and
    a button module electrically connected to the pin, and the button module comprising a threshold unit;
    wherein the voltage selector selects one of the candidate voltages and outputs the selected candidate voltage to the determining circuit, the determining circuit receives the candidate voltage outputted from the voltage selector and outputs the candidate voltage to the button module for testing whether the threshold unit will be conducted to find a threshold voltage; when the threshold unit is not conducted, the determining circuit outputs a determining signal to the voltage selector such that the voltage selector selects a next candidate voltage based upon the voltage sequence and outputs the candidate voltage to the determining circuit; when the threshold unit is conducted, the determining circuit outputs the determining signal to the voltage selector such that the voltage selector selects the candidate voltage which is arranged in front of the current candidate voltage in the voltage sequence as the threshold voltage.

2. The button detecting circuit according to claim 1, wherein when the determining circuit finds the threshold voltage, the determining circuit commands the voltage selector to keep outputting the threshold voltage.

3. The button detecting circuit according to claim 2, wherein the determining circuit outputs the threshold voltage to the button module, and the button module generates a scanning current in response to a button action of a button network, wherein the button action corresponds to at least one of a plurality of buttons disposed in the button network being pressed.

4. The button detecting circuit according to claim 3, wherein the button network is coupled to the threshold unit in parallel, the button network comprises:
    a first button unit comprising a first button and a first button resistor, wherein one end of the first button resistor is coupled to the first button, and another end of the first button resistor is coupled to a ground;
    a plurality of second button units, wherein each second button unit comprises a second button, a second button resistor and a third button resistor, one end of the second button resistor is coupled to one end of the second button, one end of the third button resistor is coupled to another end of the second button, and another end of the second button resistor is coupled to the ground.

5. The button detecting circuit according to claim 4, wherein the pin is electrically connected to the threshold unit and the button network.

6. The button detecting circuit according to claim 4, wherein resistance values respectively corresponding to the second button resistors are different from each other, a relationship between the resistance values of the second button resistors is $$N:(N+1):(N+1):\ldots:(N+M-1)$$

wherein N is a positive integer, and M is the number of the second button resistors.

7. The button detecting circuit according to claim 4, wherein the determining circuit further comprises:
    a current mirror electrically connected to the voltage source, configured to generate a mirror current in response to a current flowing through the threshold unit;
    a current comparing unit electrically connected to the current mirror, configured to generate the determining signal in response to the mirror current and output the determining signal to the voltage selector; and
    a voltage output unit electrically connected to the current mirror and the voltage selector, configured to output the candidate voltage to the button module.

8. The button detecting circuit according to claim 7, wherein the current comparing unit further comprises a current comparator, a first reference current source, a second reference current source and a current source switch, wherein one input end of the current comparator receives the current mirror, another input end of the current comparator is electrically connected to the current source switch, and the current source switch is electrically connected to one of the first reference current source and the second reference current source.

9. The button detecting circuit according to claim 8, wherein when the determining circuit does not find the threshold voltage, the current comparing unit is electrically connected to the first reference current source via the current source switch.

10. The button detecting circuit according to claim 8, wherein when, after the determining circuit finds the threshold voltage, the current comparing unit is electrically connected to the second reference current source via the current source switch.

11. The button detecting circuit according to claim 9, wherein an output current which the first reference current source outputs is equal to a conducting current which causes the threshold unit to conduct.

12. The button detecting circuit according to claim 10, wherein an output current which the second reference current source outputs changes with the scanning current for determining which one of a plurality of the buttons disposed in the button network is pressed.

13. The button detecting circuit according to claim 7, wherein the voltage output unit comprises a source follower.

14. The button detecting circuit according to claim 1, wherein the button detecting circuit further comprises a switching element, the switching element is electrically connected to the voltage source, the determining circuit and the button module.

15. The button detecting circuit according to claim 14, wherein the switching element is configured to control the voltage source to provide a voltage to the button module.

* * * * *